(12) United States Patent
Ghilardelli et al.

(10) Patent No.: US 6,590,247 B2
(45) Date of Patent: Jul. 8, 2003

(54) MOS CAPACITOR WITH WIDE VOLTAGE AND FREQUENCY OPERATING RANGES

(75) Inventors: Andrea Ghilardelli, Cinisello Balsamo (IT); Stefano Ghezzi, Treviolo (IT); Carla Maria Golla, Sesto San Giovanni (IT)

(73) Assignee: SGS-Thomson Microelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/916,954

(22) Filed: Jul. 27, 2001

(65) Prior Publication Data

US 2001/0042879 A1 Nov. 22, 2001

Related U.S. Application Data

(63) Continuation of application No. 08/900,328, filed on Jul. 25, 1997.

(30) Foreign Application Priority Data

Jul. 30, 1996 (EP) .............................................. 96830420

(51) Int. Cl.[7] .............................................. H01L 27/02
(52) U.S. Cl. ...................................... 257/296; 257/299
(58) Field of Search ................................ 257/296, 532, 257/299–313; 438/251–252, 394–395

(56) References Cited

U.S. PATENT DOCUMENTS

| | | | |
|---|---|---|---|
| 3,612,964 A | 10/1971 | Kawazu | |
| 4,001,869 A | 1/1977 | Brown | |
| 4,167,018 A | 9/1979 | Ohba et al. | |
| 4,223,333 A | 9/1980 | Masuoka | |
| 4,704,625 A | 11/1987 | Lee | |
| 5,341,009 A | * 8/1994 | Young et al. | ................ 257/296 |
| 5,360,989 A | 11/1994 | Endo | |
| 5,373,476 A | 12/1994 | Jeon | |
| 5,673,232 A | 9/1997 | Furutani | |

FOREIGN PATENT DOCUMENTS

| | | |
|---|---|---|
| EP | 0 031 107 A1 | 7/1981 |
| EP | 0 464 453 A1 | 1/1992 |

OTHER PUBLICATIONS

European Search Report from European Patent Application 96 830420.4, filed Jul. 30, 1996.
Patent Abstracts of Japan, vol. 16, No. 360 (E–1243), Aug. 4, 1992 & JP–A–04 112564 (NEC IC Microcomput. Syst. Ltd.), Apr. 14, 1992.
Patent Abstracts of Japan, vol. 7, No. 280 (E–216), Dec. 14, 1983 & JP–A–58 159367 (Matsushita Denshi Kogyo KK) Sep. 21, 1983.

* cited by examiner

Primary Examiner—Minh Loan Tran
Assistant Examiner—Thomas L Dickey
(74) Attorney, Agent, or Firm—Wolf, Greenfield & Sacks, P.C.; James H. Morris

(57) ABSTRACT

A MOS capacitor comprises a semiconductor substrate, a first well region of a first conductivity type formed in the substrate, at least one doped region formed in the first well region, and an insulated gate layer insulatively disposed over a surface of the first well region. The at least one doped region and the insulated gate layer respectively form a first and a second electrode of the capacitor. The first well region is electrically connected to the at least one doped region to be at a same electrical potential of the first terminal of the capacitor.

3 Claims, 3 Drawing Sheets

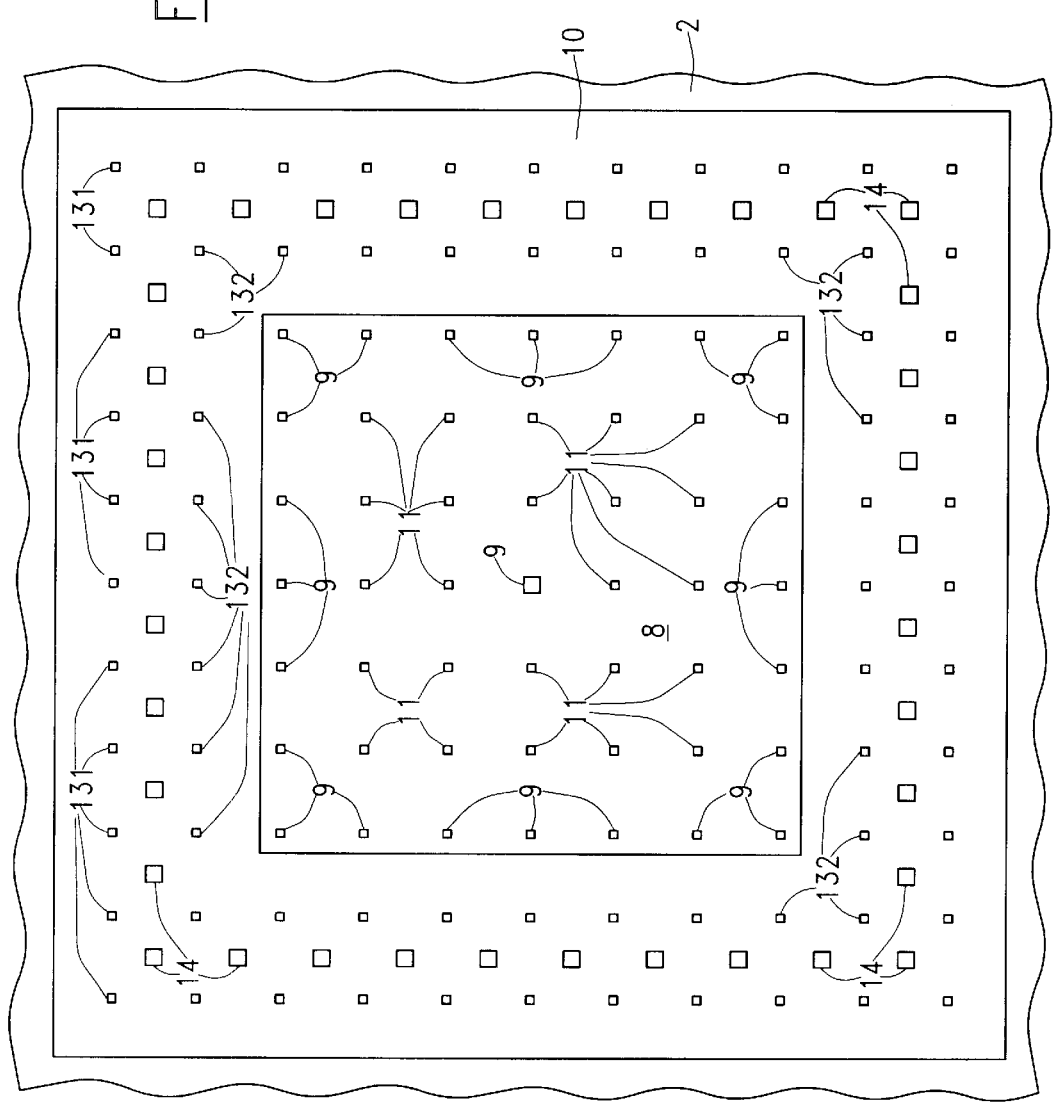

MOS CAPACITOR WITH WIDE VOLTAGE AND FREQUENCY OPERATING RANGES

This application is a continuation of application Ser. No. 08/900,328 filed on Jul. 25, 1997.

BACKGROUND OF THE INVENTION

1. Field of the Invention

The present invention relates to a MOS capacitor with wide voltage and frequency operating ranges.

2. Discussion of the Related Art

In the field of integrated circuits, integrated MOS capacitors are commonly used.

For example, in EPROM, EEPROM and Flash EPROM integrated circuits MOS capacitors are employed for integrating charge pumps for boosting the supply voltage. The use of MOS capacitors is common especially in the field of Flash EPROM devices, where there is a trend towards using devices having a single power supply, possibly with values lower than 3 V. In Flash EPROM devices, it is necessary to internally boost the voltage supply to generate voltages for read, programming and erasing operations.

To this end, integrated capacitors having different capacitances and operating in different biasing conditions are commonly provided.

Known MOS capacitors are substantially of two types: N-well (or P-well) capacitors, and PMOS (or NMOS) capacitors.

An N-well capacitor comprises an N type well formed in a P type substrate, with an insulated gate superimposed over the N type well and an N+ contact region inside the N type well. Essentially, an N-well capacitor is a P-channel MOSFET without source and drain diffusions. The electrodes of the capacitor are respectively formed by the insulated gate and the N type well. As is known, the capacitance is a function of the voltage applied to the gate. There are two gate voltage ranges wherein the capacitance value is acceptable, that is, for gate to N-well voltages lower than the threshold voltage (the gate voltage that causes an inversion layer to be formed in the N type well under the insulated gate) and for gate to N-well voltages higher than the so-called flat-band voltage (that is, in the so-called accumulation operating region). For gate voltages between these two ranges, that is, in the so-called depletion region, the capacitance value is approximately one half or one third the capacitance in accumulation and inversion operating regions. Furthermore, the N-well capacitor can operate in inversion region only for low frequencies, because the formation of the inversion layer, being due to generation-recombination processes, is slow. In conclusion, the N-well capacitor works sufficiently well only in the accumulation region, that is, for gate voltages sufficiently positive.

Similar consideration hold true for a P-well capacitor, which is the dual counterpart of the previously described N-well capacitor, with N type regions and P type regions interchanged.

A PMOS capacitor comprises an N type well formed in a P type substrate with at least one P+ diffused region inside the N type well, an insulated gate superimposed over the N-type well, and an N+ contact region to the N type well. The two terminals of the capacitor are the insulated gate and the P+ diffusion; the N type well is biased at a constant potential (generally the most positive voltage inside the chip) suitable to keep the N well/P substrate junction reverse biased. Due to the presence of the P+ region, the inversion region can be reached quite fast, but it is not possible to operate the capacitor in the accumulation region (because the terminals of the capacitor do not comprise the N type well). Consequently, this capacitor has a sufficiently high capacitance only in the inversion region, that is, for gate voltages sufficiently negative.

Similar consideration hold true for an NMOS capacitor, which is again the dual counterpart of the PMOS capacitor with N type regions and P type regions interchanged.

From the above considerations, it follows that N-well capacitors can only be used for positive charge pumps (and similarly P-well capacitors can only be used for negative charge pumps), while PMOS capacitors can only be used for negative charge pumps (and NMOS capacitors can only be used for positive charge pumps).

In view of the state of the art described, it is an object of the present invention to provide a MOS capacitor structure having as far as possible an "ideal" behavior, that is, a capacitor having substantially the same capacitance for any voltage applied across it and for any frequency variation of this voltage.

SUMMARY OF THE INVENTION

According to one embodiment of the present invention, these and other objects are achieved by a MOS capacitor comprising a semiconductor substrate, a first well region of a first conductivity type formed in said substrate, at least one first doped region formed in said first well region, and an insulated gate layer insulatively disposed over a surface of the first well region, the at least one first doped region and the insulated gate layer respectively forming a first and a second electrode of the capacitor, characterized in that the first well region is electrically connected to the at least one first doped region to be at a same electrical potential of the first electrode of the capacitor.

In another embodiment of the invention, the at least one first doped region includes a plurality of spaced-apart doped regions, and the insulated gate layer is insulatively disposed over the whole surface of the first well region.

In another embodiment of the invention, the MOS capacitor comprises a first contact doped region of the first conductivity type formed in the first well region for biasing the first well region, the first contact doped region being electrically connected to the first doped regions. Further, the semiconductor substrate can be of the second conductivity type or of the first conductivity type.

In the latter case, the MOS capacitor can further comprise a second well region of the second conductivity type formed in the semiconductor substrate and containing the first well region. A second doped contact region of the second conductivity type is in this case formed in the second well region for biasing the second well region at a potential suitable for isolating the first well region from the semiconductor substrate.

In another embodiment of the invention, the insulated gate layer also extends over a surface of the second well region, and at least a second doped region of the second conductivity type is formed in the second well region and is electrically connected to the first doped region and to the first doped contact region inside the first well region.

In another embodiment of the invention, the MOS capacitor further comprises at least a third doped region of the first conductivity type formed in the second well region and electrically connected to the first and second doped regions and to the first doped contact region.

BRIEF DESCRIPTION OF THE DRAWINGS

The features of the present invention will be made more evident by the following detailed description of some embodiments thereof, described as non-limiting examples in the annexed drawings, wherein:

FIG. 7 shows in top-plan view at the level of the semiconductor substrate surface a MOS capacitor according to a preferred practical implementation of the embodiment of FIG. 6.

DETAILED DESCRIPTION

Figure 1:
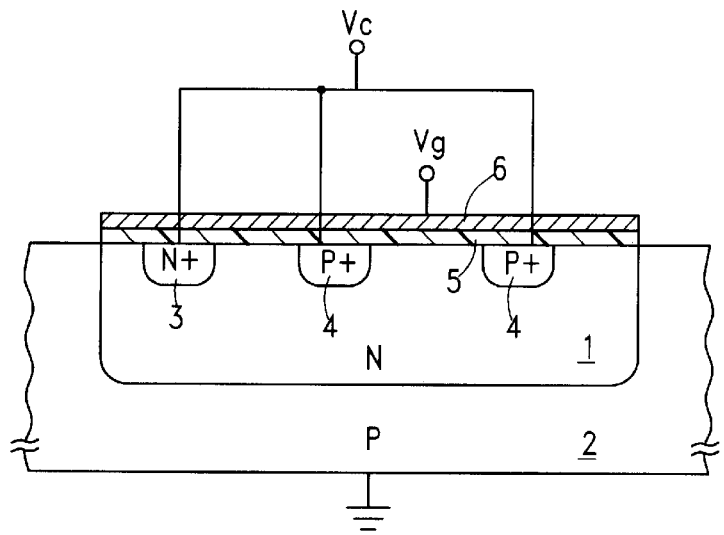
FIG. 1 shows in cross-sectional view a first embodiment of MOS capacitor according to the present invention.

Referring to FIG. 1, a cross-section of a MOS capacitor according to a first embodiment of the present invention is shown. The MOS capacitor comprises an N type well region 1 formed in a P type semiconductor substrate 2. Inside the N type well 1, an N+ contact region 3 is formed to provide a biasing for the N type well, as well as two spaced-apart P+ regions 4. It should be noted that a single P+ region 4 could be sufficient; however, providing more P+ regions 4 properly distributed inside the N type well 1 ensures a better control (minimization) of parasitic resistances. Over the N type well 1, an insulated gate is formed comprising an insulating layer 5, typically of $SiO_2$, and a conductive layer 6, typically doped polysilicon; the insulated gate substantially covers entirely the N type well 1 with the exception of small contact windows for contacting regions 3 and 4. The surface portion of the N type well 1 under the insulated gate forms a channel region.

The P type substrate 1 is electrically connected to ground; the N+ contact region 3 and the P+ regions 4 form a first electrode of the capacitor, and are electrically connected to a voltage Vc; the conductive layer 6 forms a second electrode of the capacitor and is electrically connected to a voltage Vg.

Figure 2:
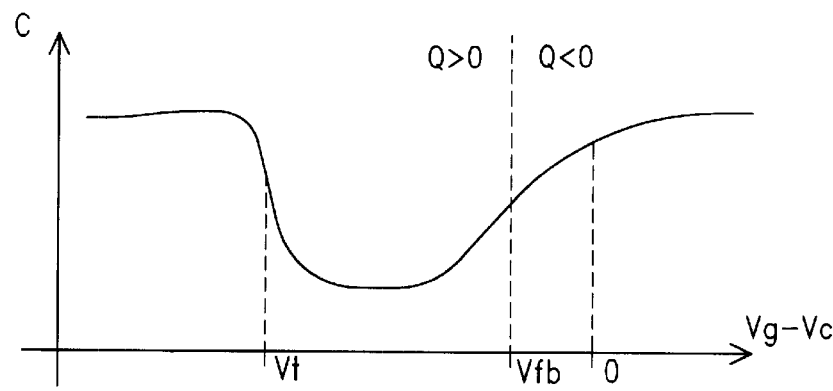
FIG. 2 is a diagram showing the capacitance variation against gate voltage of the MOS capacitor of FIG. 1

The structure of FIG. 1 is substantially equal to that of a conventional PMOS capacitor (previously described), with the difference that in this case the N+ contact region which provides biasing to the N type well 1 is short-circuited with the P+ regions 4 instead of being connected to an independent voltage supply. In this way, the N type well 1 can act as an electrode of the capacitor when the latter is operated in the accumulation region, that is, when the voltage (Vg−Vc) is higher than the flat-band voltage Vfb (FIG. 2). When the voltage (Vg−Vc) is lower than the threshold voltage Vt, the capacitor is in the inversion region. As in the case of PMOS capacitors, the presence of the P+ regions 4 improves the behavior of the capacitor in the inversion region, because they inject holes and it is therefore not necessary to wait for the relatively slow generation-recombination process to create the inversion channel under the insulated gate. However, in the voltage range comprised between the threshold voltage Vt and the flat-band voltage Vfb the capacitance is small, approximately one half or one third of its value in the inversion and accumulation regions. Furthermore, the voltage Vc should be kept positive, to prevent the N well/P substrate junction to be forward biased.

Figure 3:
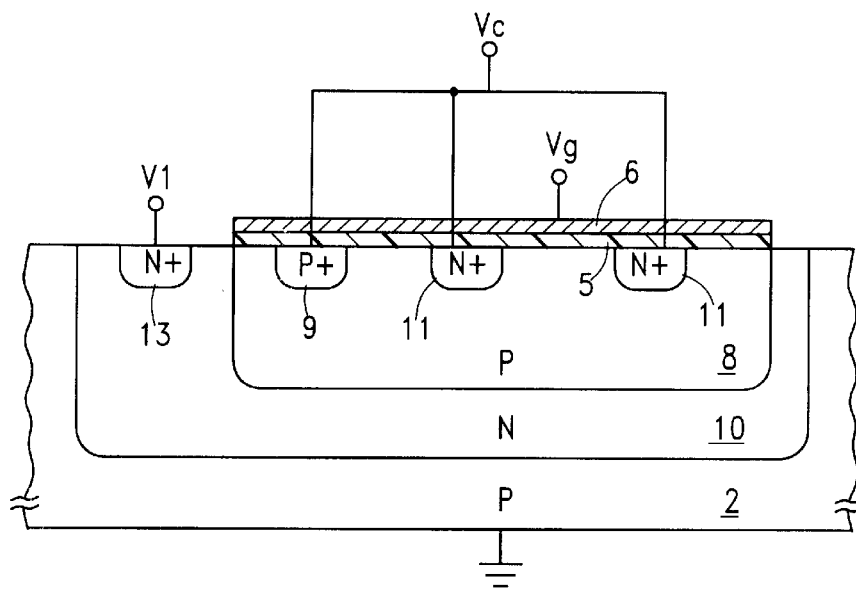
FIG. 3 shows in cross-sectional view a second embodiment of MOS capacitor according to the invention.

FIG. 3 shows in cross-section a MOS capacitor according to a second embodiment of the invention. The MOS capacitor comprises an N type well 10 formed in a P type substrate 2, and a P type well 8 formed within the N type well 10. Inside the P type well 8, a P+ contact region 9 is formed for providing a biasing to the P type well 8, and two spaced-apart N+ regions 11. As in the case of FIG. 1, a single N+ region 11 could be sufficient, but better performances are achieved by providing more N+ regions 11. Over the whole surface of the P type well 8, an insulated gate is provided comprising the SiO2 layer 5 and the doped polysilicon layer 6; the surface portion of the P type well 8 under the insulated gate forms a channel region. An N+ contact region 13 is further formed inside the N type well 10. The N+ regions 11 and the P+ contact region 9 are short-circuited to each other and electrically connected to voltage Vc, and form a first electrode of the MOS capacitor; the polysilicon layer 6 is electrically connected to voltage Vg and forms a second electrode of the capacitor. The N+ contact region 13 is electrically connected to a voltage Vl higher than Vc, to prevent the P well/N well junction from being forward biased. The substrate 2 is conventionally kept grounded.

The MOS capacitor of FIG. 3 is an NMOS capacitor. Similarly to the first embodiment, the P type well 8 is short-circuited to the N+ regions 11, so that the P type well 8 can act as an electrode of the capacitor when the latter is operated in the accumulation region. When operated in the inversion region, the capacitor of FIG. 3 has better frequency performance than that of FIG. 1, because the inversion channel is made up of electrons instead of holes, and it is known that electrons have a higher mobility than holes. The N type well 10 is necessary when the voltage Vc is not equal to ground, in order to isolate the P type well 8 from the P type substrate 2; if however Vc=GND (that is, the P type well 8 is kept at the same potential as the substrate 2), the N type well 10 can be eliminated.

Figure 4:
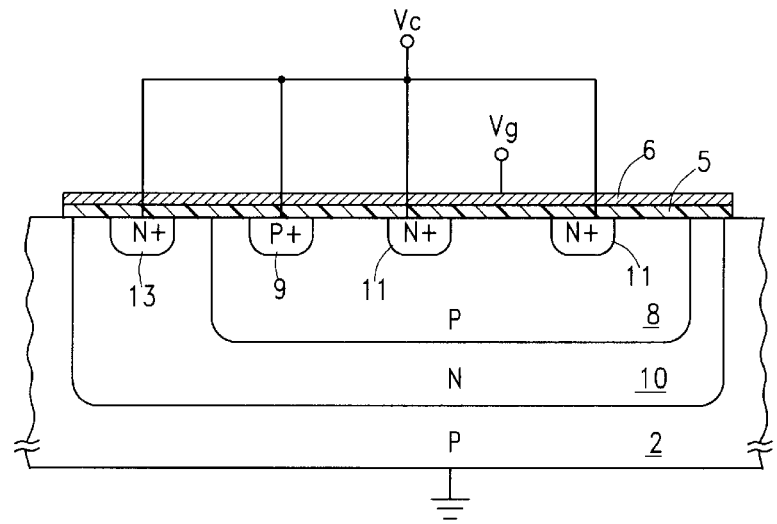
FIG. 4 shows in cross-sectional view a third embodiment of MOS capacitor according to the invention.

FIG. 4 shows in cross-section a MOS capacitor according to a third embodiment of the invention. The structure is substantially identical to that shown in FIG. 3, with the difference that the insulated gate (i.e., the SiO2 layer 5 and the polysilicon layer 6) extends over the N type well 10, and the N+ contact region 13 is electrically connected to voltage Vc. This structure is equivalent to the parallel connection of an NMOS capacitor with an N-well capacitor: the NMOS capacitor formed in the P type well 8, and the N-well capacitor formed in the N type well 10. One electrode of the capacitor is represented by the polysilicon layer 6, the other electrode is represented by the N+ regions 11, the P type well 8 and the N type well 10 which are short-circuited to each other.

Figure 5:
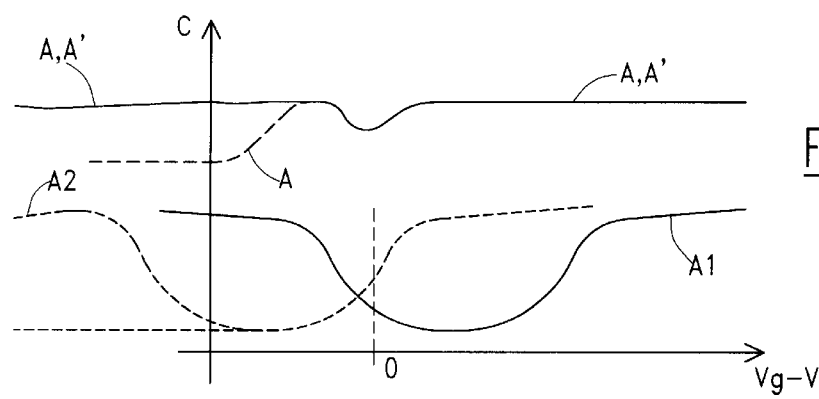
FIG. 5 is a diagram showing the capacitance variation against voltage of the MOS capacitor of FIG. 4.

The capacitance C of the MOS capacitor of FIG. 4 versus the voltage (Vg−Vc) is depicted in FIG. 5, curve A; in this figure, curve A1 represents the capacitance variation with voltage of the NMOS capacitor formed inside the P type well 8, while curve A2 (dotted) represents the capacitance variation with voltage of the N-well capacitor formed inside the N type well 10; the bifurcation in curve A2 at negative values of (Vg−Vc) accounts for the different behavior of the N-well capacitor for low frequencies and high frequencies. It is possible to see that at least for low frequencies curve A is almost flat, i.e. the capacitor of FIG. 4 has an almost "ideal" behavior; this is due to the fact that when one capacitor operates in the depletion region (low capacitance) the other capacitor is either in the inversion or in the accumulation region; furthermore, problems related to the frequency of variation of voltage (Vg–Vc) are eliminated, because when one capacitor operates in the inversion region, the other operates in the accumulation region. However, the capacitance of the capacitor of FIG. 4 lowers for Vg–Vc<0 and at high frequencies, due to the bifurcation in curve A2.

Figure 6:
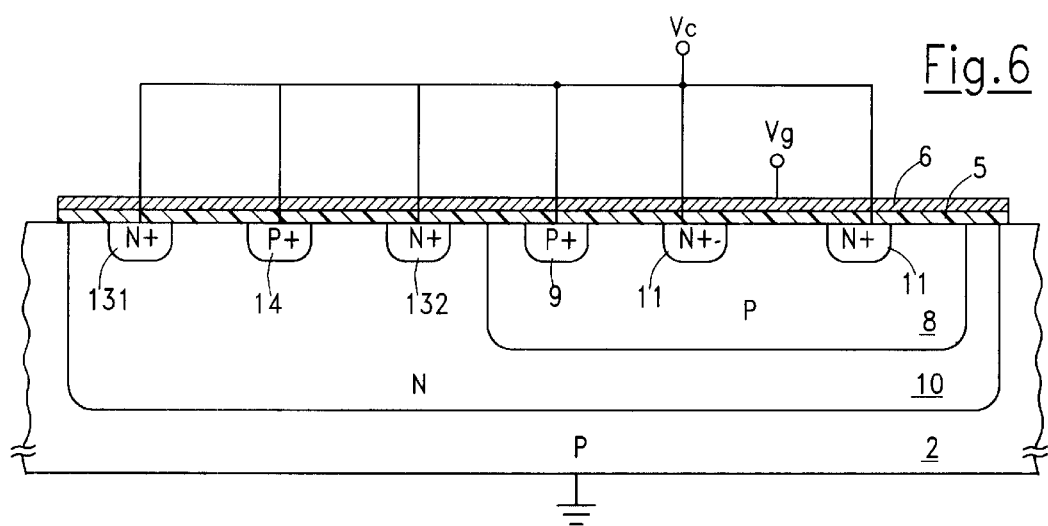
FIG. 6 shows in cross-sectional view a fourth embodiment of MOS capacitor according to the invention.

FIG. 6 shows in cross-section a MOS capacitor according to a fourth embodiment of the present invention. This structure is substantially identical to that shown in FIG. 4, except for the fact that the N+ region 13 has been replaced by two N+ regions 131, 132, and a P+ region 14 is provided in the N type well 10 between regions 131 and 132. The provision of the P+ region 14 inside the N type well 10 improves the frequency response of the N-well capacitor in the inversion region, because the P+ region 14 supplies holes for the inversion channel. Thanks to this, the capacitance is that shown by curve A', FIG. 5.

FIG. 7 shows in top-plan view at the level of the surface of the substrate 2 a preferred practical implementation of the MOS capacitor of FIG. 6. The N type well 10 has substantially a rectangular shape (square in the shown example), and the P type well 8 has a similar rectangular shape. A plurality of N+ diffusions 131 are provided inside the N type well 10, substantially disposed all along the inner perimeter of N type well 10; a plurality of P+ diffusions 14 is also provided, concentrical with the N+ diffusions 131, and, concentrical with the P+ diffusions 14, a plurality of N+ diffusions 132 is provided. Inside the P type well 8, a plurality of P+ diffusions 9 is provided all along the perimeter of the P type well 8, and two concentrical pluralities of N+ diffusions 11 are also provided; substantially at the center of the P type well 8, a further P+ diffusion 9 is also provided. The insulated gate layer covers the whole surface of the N type and P type wells 10 and 8; to each diffusion 131, 14, 132, 9 and 11 corresponds a respective opening in the insulated gate layer to allow the underlying diffusion to be contacted by a metallization layer (not shown).

Due to this arrangement, it is possible to minimize the distance between the N+ diffusions inside the P type well 8, and between the P+ diffusions inside the N type well 10. This is necessary to assure that the resistance between said diffusions is negligible, otherwise the movement of the minority charges which are supplied to the inversion regions is slowed down and the capacitance at high frequencies is reduced.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A MOS capacitor comprising:
   a semiconductor substrate of a first conductivity type;
   a first well region of a second conductivity type formed within said substrate;
   a second well region of the first conductivity type formed within said first well region;
   at least one first plurality of doped contact regions of the second conductivity type formed in said first well region for biasing said first well region and disposed substantially along the inner perimeter of said first well region;
   at least one first plurality of doped regions of first conductivity type formed within said first well region disposed substantially concentric to the said at least one first plurality of doped contact regions of the second conductivity type;
   at least one second plurality of doped contact regions of the first conductivity type formed in said second well region for biasing said second well region and disposed substantially along the inner perimeter of said second well region; and
   at least one second plurality of doped regions of second conductivity type formed in said second well region and disposed substantially concentric to said at least one second plurality of doped contact regions of first conductivity type.

2. The MOS capacitor according to claim 1, further comprising at least one second plurality of doped contact regions of the second conductivity type formed inside said first well region for biasing said first well region and disposed substantially concentric to said at least one first plurality of doped regions of the first conductivity type.

3. The MOS capacitor according to claim 2, further comprising at least one doped contact region of first conductivity type formed in the said second well region for biasing said second well region and disposed substantially at the center of said second well region.

* * * * *